United States Patent [19]

Rapp et al.

[11] 4,361,348
[45] Nov. 30, 1982

[54] REINFORCED GASKET FOR SEGMENTED HOUSING

[75] Inventors: Karl Rapp; Joachim Choschzick, both of Erlangen, Fed. Rep. of Germany

[73] Assignee: Siemens Aktiengesellschaft, Berlin & Munich, Fed. Rep. of Germany

[21] Appl. No.: 187,060

[22] Filed: Sep. 15, 1980

[30] Foreign Application Priority Data

Sep. 28, 1979 [DE] Fed. Rep. of Germany ....... 2939427

[51] Int. Cl.³ .......................................... F16L 25/00
[52] U.S. Cl. .................................... 285/31; 285/363; 285/DIG. 11; 277/235 R
[58] Field of Search ................... 285/31, 9, 16, 19, 41, 285/335, 224, DIG. 11, 363, 325, 97; 277/211, 235, 178, 34.3, 166, 182–186; 138/94.5

[56] References Cited

U.S. PATENT DOCUMENTS

| | | | |
|---|---|---|---|
| 2,191,044 | 2/1940 | Seligman | 285/DIG. 11 |
| 2,513,178 | 6/1950 | Jackson | 285/363 |
| 3,153,541 | 10/1964 | Rudder | 277/235 |
| 3,433,488 | 3/1969 | Grantom | 285/31 |
| 3,516,688 | 6/1970 | Gachot | 285/31 |

FOREIGN PATENT DOCUMENTS

| | | | |
|---|---|---|---|
| 735401 | 8/1955 | United Kingdom | 285/363 |
| 1188711 | 4/1970 | United Kingdom | 285/31 |

Primary Examiner—Dave W. Arola
Attorney, Agent, or Firm—Kenyon & Kenyon

[57] ABSTRACT

In local traffic vehicles electrical equipment to be cooled by forced air is mounted in separate housings connected into a group of segmented housings by a reinforced gasket inserted between juxtaposed ends of adjacent ones of the housings. The reinforced gasket includes a rigid, open frame having a configuration that matches the shape of the openings of the housings on each side. Elastomeric sealing rings are attached airtight to extend from opposite faces of the rigid frame and to press against the ends of the housings on each side of the frame. The elastomeric surfaces are sufficiently deformed to provide a good, airtight seal between each successive pair of housings and yet the reinforced gasket can be slid out from between the housings and replaced without requiring that the housings on each side be disturbed. This permits any housing in the group to be removed for service of the device therein without disturbing any of the other housings.

7 Claims, 4 Drawing Figures

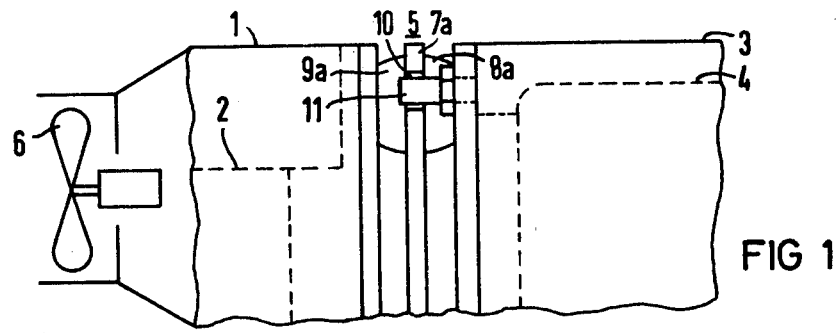
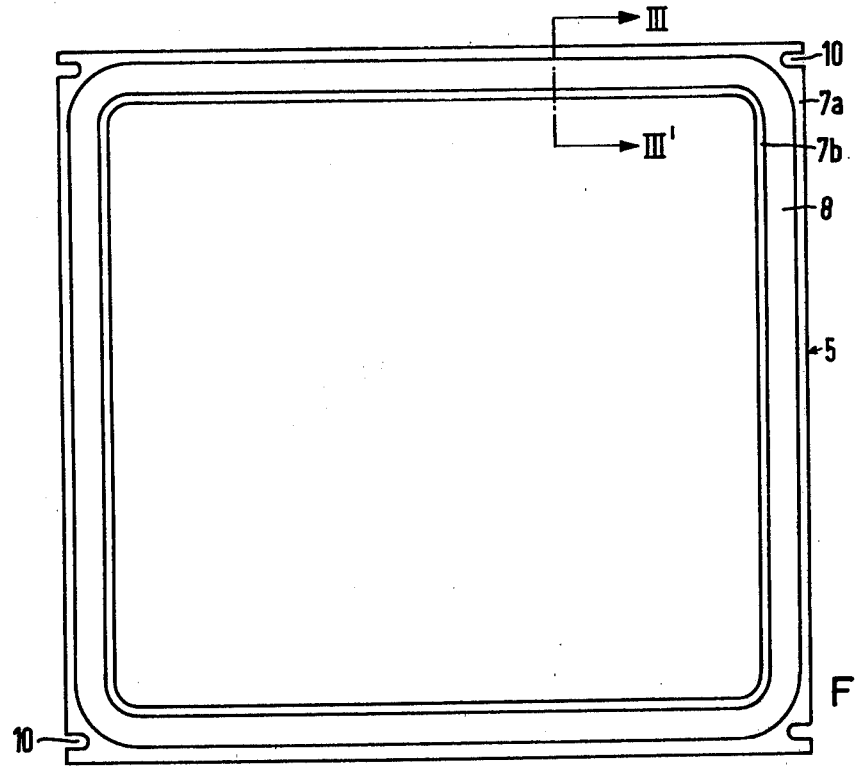
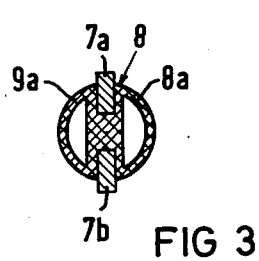
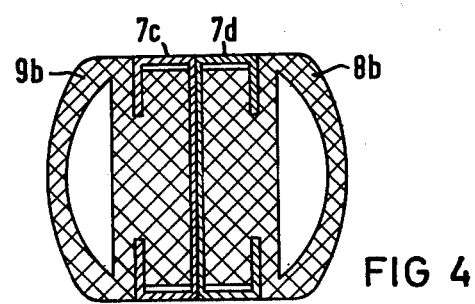
FIG 1
FIG 2
FIG 3
FIG 4

REINFORCED GASKET FOR SEGMENTED HOUSING

BACKGROUND OF THE INVENTION

This invention relates to a reinforced gasket to seal segmented housing sections together to permit easy removal of each section for service of apparatus contained therein. In particular the invention relates to ventilating apparatus and segmented housings with reinforced gaskets therebetween for use in vehicles used for local traffic.

Electrical devices of relatively large volume, such as DC control elements, invertors, chokes, and, for energy recovery, heat exchangers and filter members as well as heaters and heat accumulators are being installed in increasing numbers in local traffic vehicles. In order to cool these devices they are usually assembled side by side, each in its own housing and with the housings connected together to form one relatively long segmented housing through which air can be blown by a suitable blower. It is sometimes necessary to provide several such segmented housings in a vehicle. In order to service the device in an individual segment it is desirable to be able to separate that segment from the rest of the same group, but at the same time it is desirable that the intersection between successive segments be airtight to prevent leakage of the cooling air before it has had time to traverse the entire chain of housings.

Gaskets between successive segments of a segmented housing for such use are usually constructed in the form bellows that have a relatively large overall link and are bolted to the adjoining housings. In such cases it is common to find that some of the bolts are inaccessible for easy disassembly, especially those facing the floor of the vehicle. This can be circumvented to some degree by omitting the bolts or by providing a labyrinth seal on the flange of the bellows on the inaccessible side and hanging into the flange of the housing. Such a junction is likely not to be airtight and leaks that do occur must be tolerated.

Another possibility for making an airtight junction between housing segments is to bolt a tubular hollow section of rubber firmly to the flange of one housing and to push the adjacent equipment in the group so close that a good all-around seal is provided by deformation of the rubber profile. In such a case, removal of a housing segment in the middle of a chain of such segments is possible only by moving all of the adjacent housings in one direction or the other. Lowering or inserting a housing without moving the adjacent housings aside results in the possibility of damage.

One of the objects of the present invention is to provide an improved gasket of minimal overall length to increase the total length of the chain as little as possible and to provide, by virtue of its mechanical construction, a sealing connector that does not require the use of bolts, particularly on the side facing the floor of the vehicle.

A further object is to provide an improved gasket that makes it possible to remove any housing in a chain of such housings without having to move adjacent housings.

A still further object of the invention is to provide a reinforced gasket that is essentially self-supporting and can easily be locked to adjacent housing members to prevent it from working free.

SUMMARY OF THE INVENTION

According to the present invention a reinforced gasket is provided in the form of a rigid frame of a shape suitable to fit the perimeter of the openings on the housings on each side. A toriodal elastomeric sealing ring is attached to each face of the rigid perimeter frame to press against flat, annular, flange surfaces that extend parallel to corresponding flange surfaces of the housings on each side of the frame. The elastomeric sealing ring includes a first section that is interlocked with the rigid frame and second and third sections that are joined airtight to the first section to form an airfilled torus. It is to be noted that the torus is not restricted to a circular form, either in plan view or in cross section, the plan view being such as to correspond to the shape of the rigid frame. The second and third sections of the elastomeric sealing ring extend outwardly from the respective opposite faces of the rigid frame by a distance that makes the overall thickness of the gasket somewhat greater than the normal spacing between the housing flanges on each side. By virtue of the airfilled cross section of the toriodal elastomeric sealing ring, the latter can be compressed sufficiently to be forced between the adjacent housings and to form an excellent airtight seal with the housings on each side.

BRIEF DESCRIPTION OF THE DRAWINGS

FIG. 1 shows a fragment of a multi-segment housing with cooling means at one end and with a reinforced gasket according to this invention inserted between two of the housing sections.

FIG. 2 shows a plan view of the gasket means in FIG. 1.

FIG. 3 shows a cross-sectional view of the reinforced gasket in FIGS. 1 and 2.

FIG. 4 shows a modified embodiment of the portion of the gasket in FIG. 3.

DETAILED DESCRIPTION OF THE INVENTION

FIG. 1 shows a ventilated housing 1 that contains an electrical device which, in this case, is a DC control element 2. The housing 1 is part of a segmented group of housings that also includes a housing 3 for an inverter 4. The two housings 1 and 3 are connected to each other by a reinforced gasket 5 so that air drawn into the segmented housing by a fan 6 will be forced through the housings 1 and 3 and other housings connected thereto to cool the electrical components in the various housings without leaking out at any of the intersections between adjacent housings.

The gasket 5 includes a rigid frame shaped according to the perimeter of the opening between the housings 1 and 3 so as to fit around the perimeter of this opening. Two elastomeric sealing rings 8a and 9a are secured airtight to opposite faces of the frame to provide a completely airtight transition from the housing 1 to the housing 3. The sealing rings 8a and 9a are essentially toroidal although their cross-sectional shape need not be the usual circular configuration commonly thought of in connection with toroidal devices, and the rings are arranged in parallel planes in such a manner that the reinforced gasket 5 can be inserted and withdrawn from between the housings 1 and 3 without shifting the housing apart from each other but, instead, allowing them to remain firmly mounted on a vehicle.

FIG. 2 shows a plan view of the reinforced gasket 5 including the rigid outer reinforcing perimeter frame member 7a and an inner member 7b that has an inwardly directed edge that defines an open area through which the air passes from 1 housing to the next. In this case, the reinforced frame is four sided but it is not necessarily limited to that configuration. The elastomeric sealing means in FIG. 2 is illustrated as a ring 8 having generally the same shape as the perimeter frame. As shown in FIG. 3 the outer and inner reinforcing frame members 7a and 7b are spaced apart and may be considered to be concentric with each other in the sense that the frame member 7a extends entirely around the frame outside of the frame member 7b. Both of these frame members engage a central section of the toriodal elastomeric member 8. As shown in the cross-sectional view in FIG. 3, this elastomeric member includes two parts 8a and 9a that extend outwardly from the central section and enclose separate air spaces between their inner surfaces and the central section. The outer cross-sectional configuration of the toriodal member is essentially circular in this embodiment. The thickness of the complete reinforced gasket assembly in the direction perpendicular to the opposite faces of the reinforcing members 7a and 7b is such that, when this reinforced gasket is inserted between the juxtaposed flanges of adjacent housings 1 and 3 in FIG. 1, there is an entry angle formed by the tangent at the point of contact with the flanges that is smaller than 15°. When the reinforced gasket is inserted between adjacent housings it may be held in place simply by elastic deformation of the sealing member or members. However, in order to prevent it from being shaken out by vibration, elongated slots 10 may be provided in all four of the corners to fit over bolts such as the bolt 11 attached to the housing 3 in FIG. 1. The design and dimensions of the bolt 11 and others like it are such that it can be screwed into and taken out of one or both of two adjacent housing flanges in order to insert the reinforced gasket.

Another embodiment for a reinforced gasket is shown in FIG. 4. In this embodiment the parts are symmetrically constructed to include two elastomeric members, each of which may be considered a hollow toroidal ring of which only a cross-sectional view is shown in this figure. Each of the parts 8b and 9b has a main portion fitted into two rigid reinforcing frame parts 7c and 7d. In this embodiment these reinforcing parts are not coaxial but are joined together back to back and have generally U-shaped cross sections with inwardly turned flanges to grip the main portions of the elastomeric members 8b and 9b. While the cross-sectional view of the overall construction in FIG. 4 is not circular, it still provides the necessary elasticity to permit the reinforced gasket to be inserted between juxtaposed parallel radial flanges of adjacent housings, such as the housing 1 and 3 in FIG. 1. The embodiment in FIG. 4 also permits each reinforced gasket to be forced between two housings without shifting the housings farther apart. It likewise makes it possible to remove any housing separately from any other to repair the device inside it.

What is claimed is:

1. In ventilating apparatus arranged in aligned housings, a reinforced gasket for sealing juxtaposed ends of first and second ones of the housings, said gasket comprising:
    a rigid closed perimeter frame having two oppositely directed faces and a radially inwardly directed edge that defines an open area; and
    toroidal elastomeric sealing rings extending around the opened area on and extending axially outward from said two faces and interlocked with the perimeter frame, each of said sealing rings having a hollow section, so as to be compressible toward the rigid perimeter frame means to permit the gasket to be inserted between the first and second ones of the housings and to be withdrawn therefrom without moving the first and second ones of the housings, whereby said gasket can be inserted between the two juxtaposed ends, with said ends spaced a distance less than the combined thickness of said frame and sealing rings causing said sealing rings to be compressed to seal against said ends and hold said gasket in place.

2. The gasket as defined in claim 1 in which said toroidal elastomeric sealing rings have cross-sections bounded by an outer circular arc.

3. The gasket as defined in claim 1 or 2 in which said rigid perimeter frame comprises:
    an inner rigid perimeter frame member defining the radilly inwardly directed edge; and
    an outer rigid perimeter frame member surrounding and spaced from the inner rigid perimeter frame member, said sealing rings joined by a section of elastomeric material extending between the inner and outer rigid members, said sealing rings being integrally formed with said section and extending outwardly in opposite directions therefrom and from the respective oppositely directed faces and partially overlying said faces so as to be locked in place.

4. The gasket as defined in claim 1 in which the rigid perimeter frame means comprises back-to-back perimeter frames each of U-shaped cross-section having a base and two legs, with flanges turned inwardly to be essentially parallel to the base at the outer ends of the legs, and said sealing rings comprise:
    a first hollow toroidal ring having a section inserted behind the flanges of one of said frames with the hollow portion extending therefrom; and
    a second hollow toroidal member similarly attached to other back-to-back frame.

5. The gasket as defined in claim 2 in combination with juxtaposed ends of first and second ones of the ventilation housings in which the radii of the said circular arcs is such that an entry angle of less than 15° is formed between the circular arc and a plane tangent to said arc at the point where said arc will contact a housing when said gasket is inserted and compressed between said ends.

6. The gasket according to claim 1, and further including means for securing said frame to a perimeter flange at a ventilating housing.

7. The gasket as defined in claim 6, wherein said means for securing comprise slots in peripherally outer portions of the rigid perimeter frame, adapted to cooperate with pins in a housing flange.

* * * * *